(12) United States Patent
Yoon et al.

(10) Patent No.: US 7,986,545 B2
(45) Date of Patent: Jul. 26, 2011

(54) NON-VOLATILE MEMORY DEVICE AND METHOD OF OPERATING THE SAME

(75) Inventors: Tae-eung Yoon, Seoul (KR); Won-joo Kim, Hwaseong-si (KR); June-mo Koo, Seoul (KR); Suk-pil Kim, Yongin-si (KR); Tae-hee Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 269 days.

(21) Appl. No.: 12/465,125

(22) Filed: May 13, 2009

(65) Prior Publication Data

US 2010/0027316 A1 Feb. 4, 2010

(30) Foreign Application Priority Data

Aug. 1, 2008 (KR) .................... 10-2008-0075619

(51) Int. Cl.
*G11C 11/00* (2006.01)

(52) U.S. Cl. ............. 365/148; 365/63; 365/51; 365/105

(58) Field of Classification Search .................. 365/148, 365/51, 63, 105, 189.011
See application file for complete search history.

(56) References Cited

U.S. PATENT DOCUMENTS

| | | | |
|---|---|---|---|
| 6,385,075 B1 | 5/2002 | Taussig et al. | |
| 7,808,811 B2 * | 10/2010 | Park et al. | ..................... 365/148 |
| 2006/0133125 A1 | 6/2006 | So et al. | |
| 2007/0132049 A1 | 6/2007 | Stipe | |
| 2008/0175031 A1 * | 7/2008 | Park et al. | ....................... 365/51 |

* cited by examiner

*Primary Examiner* — Tuan T Nguyen
*Assistant Examiner* — Toan Le
(74) *Attorney, Agent, or Firm* — F. Chau & Associates, LLC

(57) ABSTRACT

A non-volatile memory device having a stack structure, and a method of operating the non-volatile memory device In which the non-volatile memory device includes a plurality of variable resistors arranged in at least one layer. At least one layer selection bit line and a plurality of bit lines coupled to the plurality of the variable resistors are provided. A plurality of selection transistors coupled between the plurality of the bit lines and the plurality of the variable resistors are provided.

13 Claims, 9 Drawing Sheets

NON-VOLATILE MEMORY DEVICE AND METHOD OF OPERATING THE SAME

CROSS-REFERENCE TO RELATED APPLICATIONS

This application claims priority to Korean Patent Application No. 10-2008-0075619, filed on Aug. 1, 2008 in the Korean Intellectual Property Office, the disclosure of which is incorporated by reference in their entirety.

BACKGROUND

1. Technical Field

One or more exemplary embodiments of the present invention relate to a semiconductor device, and more particularly, to a non-volatile memory device using variable resistors, and a method of operating the non-volatile memory device.

2. Discussion of the Related Art

Semiconductor products are required to have an increasingly compact size and increased data processing capabilities. Thus the operating speed and the integration degree of non-volatile memory devices used in the semiconductor products needs to be increased. In this regard, a multi-layered non-volatile memory device is advantageous for high integration compared to a conventional single-layered non-volatile memory device.

When using a non-volatile memory device having a multi-layered structure, memory cells can be stacked vertically, each layer having the same arrangement as that of a single-layered structure.

SUMMARY

According to one exemplary embodiment of the present invention a non-volatile memory device comprises: a plurality of variable resistors arranged in at least one layer and storing data; at least one layer selection bit line coupled to a first end of the plurality of the variable resistors; a plurality of bit lines coupled to a second end of the plurality of the variable resistors; a plurality of selection transistors coupled between the plurality of the bit lines and the plurality of the variable resistors; and a plurality of word lines coupled to the plurality of the selection transistors so as to switch the plurality of the selection transistors on or off.

The non-volatile memory device may further comprise a plurality of diodes that is coupled between the plurality of the variable resistors and the plurality of the selection transistors.

The plurality of the variable resistors may be arranged in a matrix in each layer, and the plurality of the bit lines and the plurality of the word lines may cross one another to allow selective access to the variable resistors.

The at least one layer selection bit line may comprise a plurality of branch lines that are connected to one another, and the plurality of the variable resistors may be arranged along the extension direction of the plurality of the branch lines.

The at least one layer selection bit line may comprise a first layer selection bit line and a second layer selection bit line that are separated from each other in each layer. Moreover, the first layer selection bit line may comprise a plurality of first branch lines that is connected to one another, and the second layer selection bit line may comprise a plurality of second branch lines that is connected to one another. Furthermore, the plurality of the variable resistors may be arranged in a plurality of pairs between the plurality of the first branch lines and the plurality of the second branch lines, and each pair of the variable resistors may be commonly coupled to each selection transistor.

There is a method of operating the non-volatile memory device according to another exemplary embodiment of the invention. At least one layer selection bit line may be selected among the plurality of layer selection bit lines. At least one bit line may be selected among the plurality of the bit lines. At least one word line may be selected among the plurality of the word lines.

According to another exemplary embodiment of the present invention, there is a method of operating a non-volatile memory device comprises providing a plurality of variable resistors arranged in a matrix array in at least one layer, providing at least one layer selection bit line corresponding to layers of the variable resistors, at least one bit line corresponding to rows of the variable resistors and at least one write line corresponding to columns of the variable resistors, selecting at least one layer selection bit line among the layer selection bit lines, selecting at least one bit line among the plurality of bit lines, selecting at least one word line among the plurality of word lines and applying an operational voltage to the selected at least one layer selection bit line, the selected at least one bit line and the selected at least one word line accessing at least one of the plurality of variable resistors.

BRIEF DESCRIPTION OF THE DRAWINGS

Exemplary embodiments of the present invention will become apparent and more readily appreciated from the following description of the embodiments, taken in conjunction with the accompanying drawings of which.

DETAILED DESCRIPTION OF EXEMPLARY EMBODIMENTS

Figure 1:
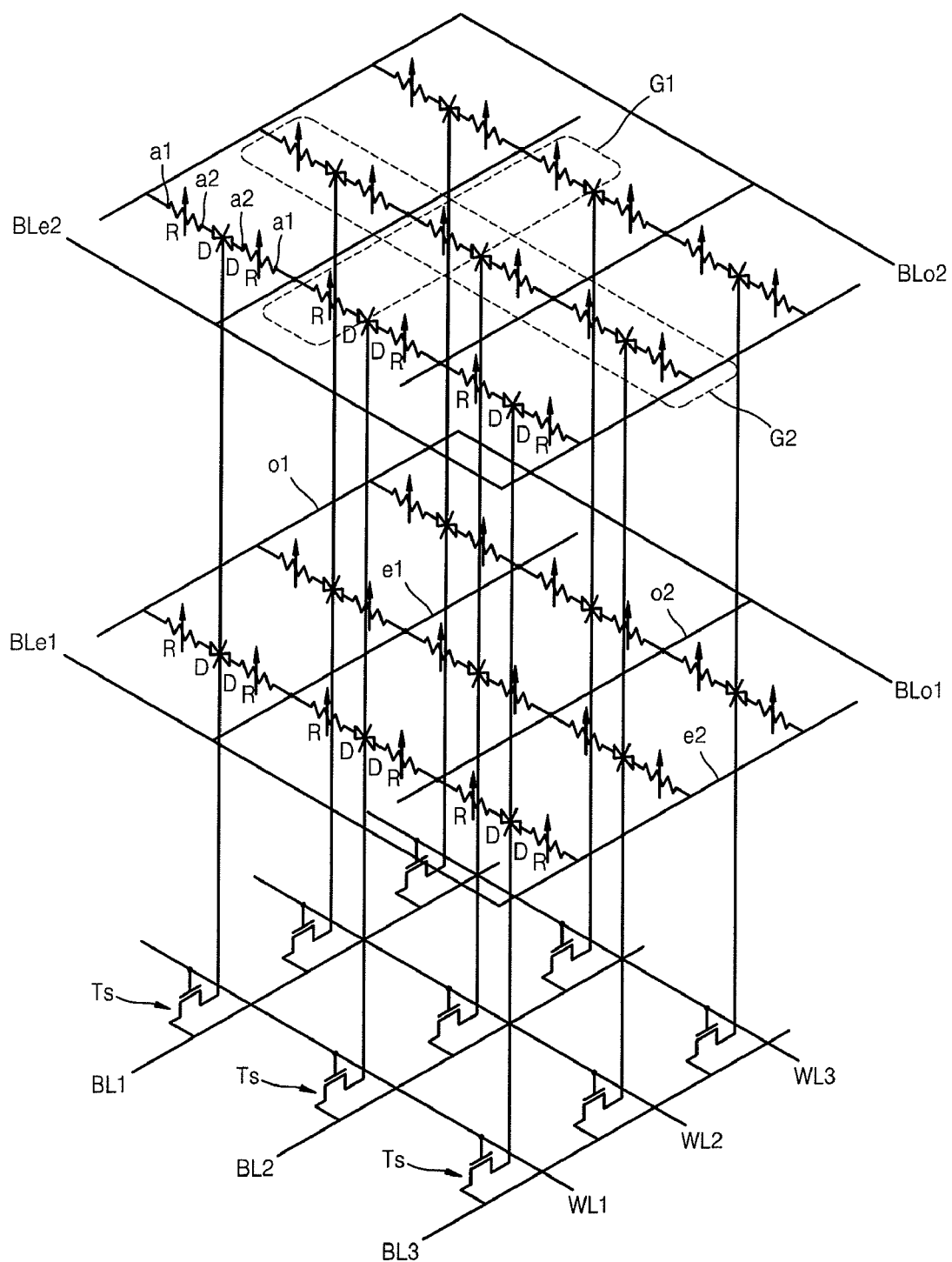
FIG. 1 is a circuit diagram illustrating a non-volatile memory device according to an exemplary embodiment of the present invention.

The present invention will be described in detail by explaining exemplary embodiments of the invention with reference to the attached drawings, wherein like reference numerals may refer to the same or similar elements throughout. In this regard, the present invention may be embodied in many different forms and should not be construed as being limited to the exemplary embodiments set forth herein. Accordingly, exemplary embodiments are merely described below, by referring to the figures, to explain aspects of the present invention. The size of elements in the drawings may be exaggerated for convenience of description.

FIG. 1 is a circuit diagram illustrating a non-volatile memory device according to an exemplary embodiment of the present invention.

Referring to FIG. 1, a plurality of variable resistors R may be arranged as at least one layer. In FIG. 1, the variable resistors R are arranged in two layers. However, the present embodiment is not limited thereto. For example, the variable resistors R may be arranged in one layer or in three or more layers.

Each of the variable resistors R may have a first end a1 and a second end a2 arranged at opposite ends to each other. For example, the variable resistors R may be arranged in a matrix in each layer. The variable resistors R may be arranged such that the first ends a1 are coupled to each other and the second ends a2 are coupled to each other. The arrangements of the variable resistors R in each layer may be identical, but the present embodiment is not limited to this example.

The variable resistors R may store resistance changes thereof locally or wholly. For example, the variable resistors R may have at least two resistance states according to an applied voltage. These variable resistance characteristics of the variable resistors R may also be maintained when the voltage is removed. Accordingly, the variable resistors R may have data storing capability.

For example, the variable resistors R may include anti-fuse materials. The resistance state of the variable resistors R may change with or without phase change thereof. When the resistance state of the variable resistors R changes with phase change, the variable resistors R may be referred to as phase change resistors. The phase change resistors R may have a high resistance state or a low resistance state according to their crystalline states. For example, the variable resistors R may include a calcogenide compound such as GST ($GeSb_x$-$Te_y$), or NiO, $Nb_2O_5$, or ZnO.

For another example, the variable resistors R may include a fuse material such as an insulation breaking material. For example, the variable resistors R may include an insulating material whose insulation can be broken according to an applied voltage. For example, the insulating material may be an oxide. Since this kind of insulation breaking material cannot be reversed once broken, the non-volatile memory device may be used as a one-time program (OTP) memory. The OTP memory may be used in products that require high memory capacity, despite its one-time usage.

Diodes D may be coupled to the second ends a2 of the variable resistors R. The diodes D may rectify currents. Two diodes D may be coupled in opposite directions to each other between the two second ends a2 of the variable resistors R adjacent to each other so as not to allow a direct current flow. For example, the diodes D may be PN diodes or Schottky diodes.

The variable resistors R may be coupled to at least one layer selection bit line. For example, the at least one layer selection bit line may include first layer selection bit lines BLe1 and BLe2 and second layer selection bit lines BLo1 and BLo2 which are separated from each other. The stack number of the variable resistors R may vary in accordance with the number of the layer selection bit lines.

For example, the first ends a1 of the variable resistors R of a first layer may be coupled to a first layer selection bit line BLe1 and a second layer selection bit line BLo1 of a first layer. The first ends a1 of the variable resistors R of a second layer may be coupled to a first layer selection bit line BLe2 and a second layer selection bit line BLo2 of a second layer.

For example, the first layer selection bit lines BLe1 and BLe2 may include a plurality of first branch lines e1 and e2 that are connected to one another, and the second layer selection bit lines BLo1 and BLo2 may include a plurality of second branch lines o1 and o2 that are connected to one another. The first branch lines e1 and e2 and the second branch lines o1 and o2 may be arranged in parallel. In addition, the first branch lines $e_n$ and the second branch lines $o_n$ may be alternately arranged, i.e. in the order o1, e1, o2, e2 in this example. The number of the first branch lines e1 and e2 and the second branch lines o1 and o2 of the present invention should not be limited thereto.

The first ends a1 of the variable resistors R may be connected to corresponding ones of the first branch lines e1 and e2 and the second branch lines o1 and o2. Accordingly, the variable resistors R are arranged in a plurality of rows along the extension direction of the first branch lines e1 and e2 and the second branch lines o1 and o2, and in a plurality of lines perpendicular to the extension direction of the first branch lines e1 and e2 and the second branch lines o1 and o2. The variable resistors R may be divided into a first group G1 arranged in rows and a second group G2 arranged in columns.

For example, a plurality of pairs of variable resistors R may be arranged along the extension direction of the first and second branch lines e1, e2, o1, and o2 between one of the first branch lines e1 and e2 and one of the second branch lines o1 and o2 that is adjacent to the one first branch lines e1 and e2. The pairs of the variable resistors R may be coupled such that a pair of diodes D are interposed between the second ends a2 of the variable resistors R.

A plurality of bit lines BL1, BL2, and BL3 may be coupled to the second ends a2 of the variable resistors R. A plurality of selection transistors Ts may be interposed between the bit lines BL1, BL2, and BL3 and the variable resistors R, and in detail, between the bit lines BL1, BL2, and BL3 and the diodes D. Accordingly, the bit lines BL1, BL2, and BL3 may be coupled to the variable resistors R via the selection transistors Ts and the diodes D.

The selection transistors Ts may be disposed below a lowermost space between the diodes D of each layer that are coupled in opposite directions to each other. The selection transistors Ts may be coupled to be shared by the two variable resistors R whose second ends a2 are coupled to each other. Accordingly, the selection transistors Ts may be arranged in a matrix so as to correspond to each pair of the variable resistors R.

Each of the bit lines BL1, BL2, and BL3 may be arranged so as to be shared by the variable resistors R of the first group G1 of each row. For example, the bit lines BL1, BL2, and BL3 may extend parallel to the first branch lines e1 and e2 and the second branch lines o1 and o2.

A plurality of word lines WL1, WL2, and WL3 may be coupled to the selection transistors Ts so as to switch the selection transistors Ts on and off. For example, the word lines WL1, WL2, and WL3 may be coupled to gates of the selection transistors Ts. The word lines WL1, WL2, and WL3 may be coupled to be shared by the selection transistors Ts arranged in each line.

For example, the word lines WL1, WL2, and WL3 may be arranged to cross the bit lines BL1, BL2, and BL3 such that selective access can be given to each pair of variable resistor R of each layer. Accordingly, the word lines WL1, WL2, and WL3 may extend across the first branch lines e1 and e2 and the second branch lines o1 and o2. Accordingly, when a voltage is applied to one of the word lines WL1, WL2, and WL3, the selection transistors Ts coupled to the variable resistors of the second group G2 may be turned on at the same time. In this case, selective access to each pair of the variable resistors R in each layer is possible by selectively applying an operational voltage to one of the bit lines BL1, BL2, and BL3.

Accordingly, at least one of the variable resistors R can be accessed by selecting at least one layer by selecting at least one of the first and second layer selection bit lines BLe1, BLe2, BLo2, and BLo2, and selecting at least one of the bit lines BL1, BL2, and BL3, and selecting at least one of the word lines WL1, WL2, and WL3.

The non-volatile memory device according to the one exemplary embodiment of present invention can be manufactured to have high capacity and high integration degree by increasing the stack number of memory cells. Accordingly, the non-volatile memory device according to one exemplary embodiment can be applied to products with large capacity.

Figure 2:
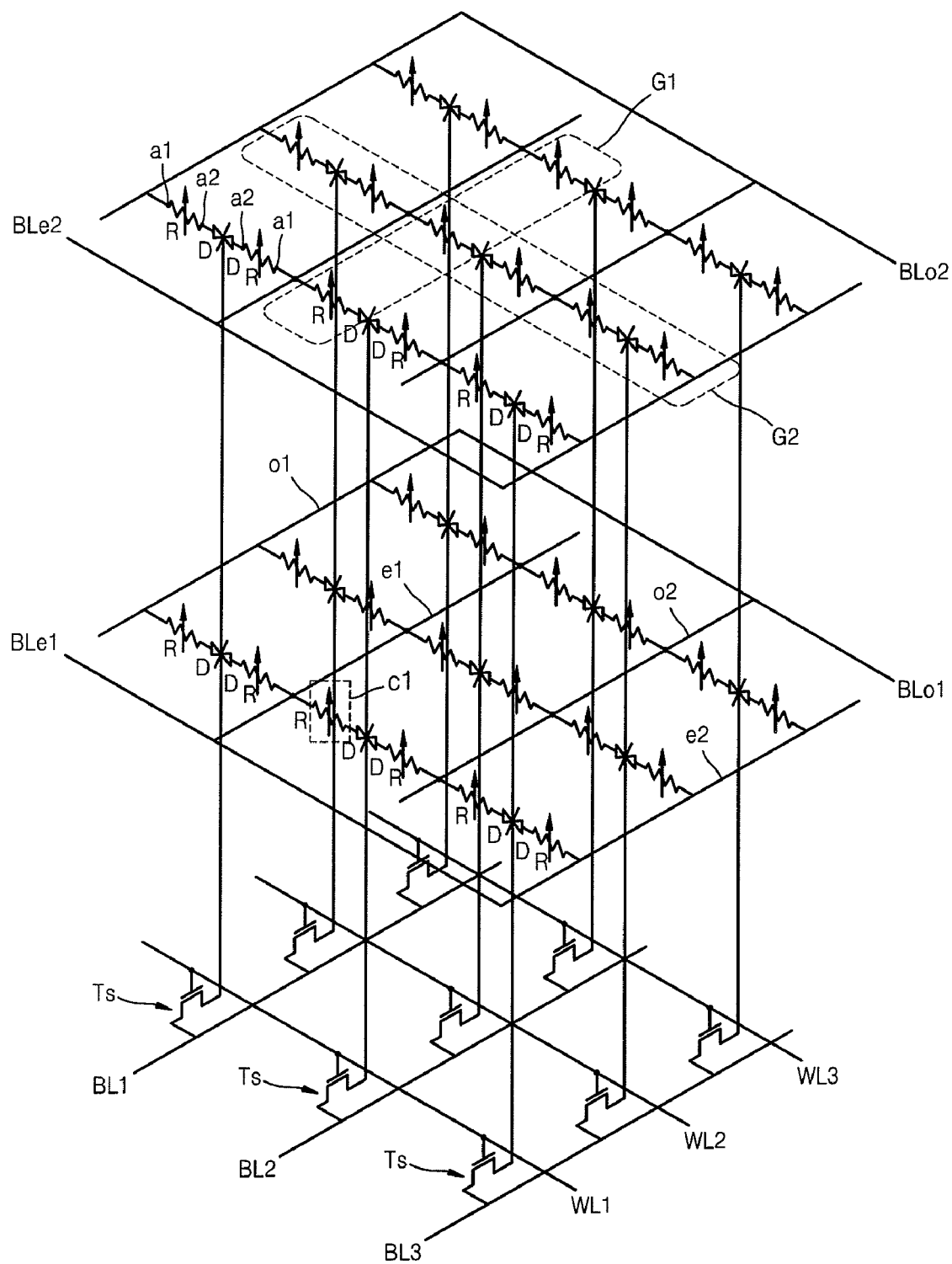
FIG. 2 is a circuit diagram illustrating a method of accessing one of the variable resistors of the non-volatile memory device of FIG. 1 according to an exemplary embodiment of the present invention.

FIG. 2 is a circuit diagram illustrating a method of operating the non-volatile memory device of FIG. 1 according to an exemplary embodiment of the present invention.

Referring to FIG. 2, one of the variable resistors R can be accessed randomly. For example, a variable resistor R in a selected memory cell C1 can be accessed by selecting one first layer selection bit line BLe1, one bit line BL2, and one word line WL1. By such random access, the non-volatile memory device can be used as a storage medium for codes.

Writing data to or reading data from the variable resistor R in the memory cell C1 can be performed by applying a corresponding operational voltage to the first layer selection bit line BLe1, the bit line BL2, and the word line WL1 after or at the same time as the above selection operations.

The above-described method of writing or reading data by randomly accessing the variable resistor R in the memory cell C1 may also be applied to other memory cells (not shown). For example, by applying required operational voltages by selecting one of the first and second layer selection bit lines BLe1, BLe2, BLo1, and BLo2, selecting one of the bit lines BL1, BL2, and BL3, and one of the word lines WL1, WL2, and WL3, selective writing/reading operation regarding a memory cell including one of the variable resistors R is possible.

Figure 3:
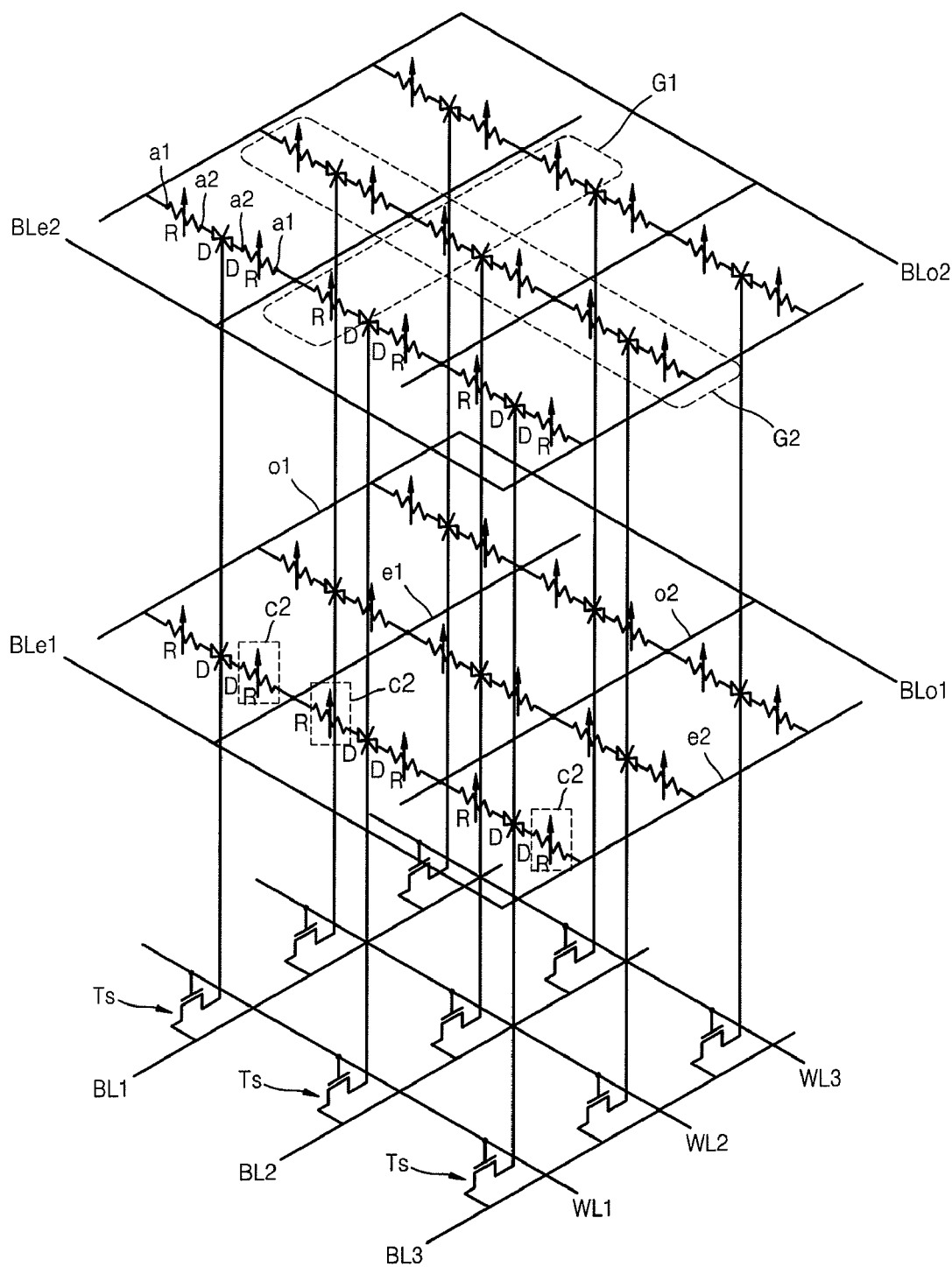
FIG. 3 is a circuit diagram illustrating a method of accessing at least two of the variable resistors of the non-volatile memory device of FIG. 1 according to another exemplary embodiment of the present invention.

FIG. 3 is a circuit diagram illustrating a method of operating the non-volatile memory device of FIG. 1 according to another exemplary embodiment of the present invention.

Referring to FIG. 3, at least two of the variable resistors R can be accessed at the same time. For example, the variable resistors R in selected memory cells C2 can be accessed at the same time by selecting one first layer selection bit line BLe1, selecting at least two bit lines BL1, BL2, and BL3, and selecting one word line WL1. By using this multiple access, the non-volatile memory device can be used as a large capacity storage medium.

Writing data to or reading data from the variable resistors R in the memory cells C2 can be performed by applying corresponding operational voltages to the first layer selection bit line BLe1, the bit lines BL1, BL2, and BL3, and the word line WL1 after or at the same time as the above selection operations.

The above-described method of writing/reading data by multiple access to the variable resistors R in the memory cells C2 may also be applied to the operation of other memory cells (not shown). For example, by selecting some of the first and second layer selection bit lines BLe1, BLe2, BLo1, and BLo2, or by selecting some of the bit lines BL1, BL2, and BL3, or by selecting some of the word lines WL1, WL2, and WL3 and applying required operational voltages, multiple writing/reading operations of the memory cells including the plurality of the variable resistors R can be performed.

Figure 4:
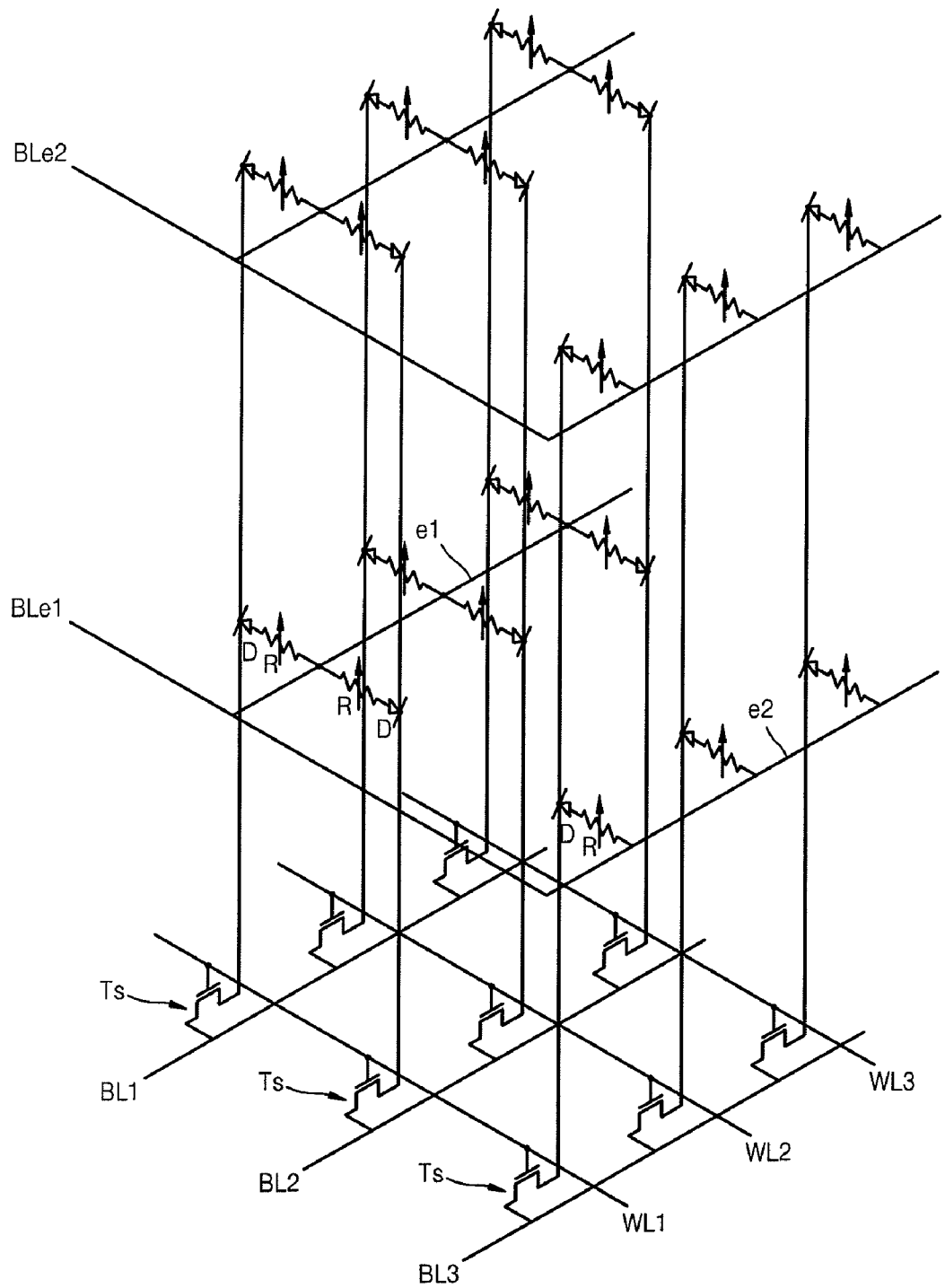
FIG. 4 is a circuit diagram illustrating a non-volatile memory device according to another exemplary embodiment of the present invention.

FIG. 4 is a circuit diagram illustrating a non-volatile memory device according to another exemplary embodiment of the present invention. The non-volatile memory device of FIG. 4 is the same as the non-volatile memory device of FIG. 1 with some modified components. Thus, common descriptions in both exemplary embodiments will be omitted.

Referring to FIG. 4, variable resistors R may be coupled to first ends a1 of first layer selection bit lines BLe1 and BLe2. In this exemplary embodiment, the second layer selection bit lines BLo1 and BLo2 of FIG. 1 and the variable resistors R coupled thereto may be omitted. Accordingly, the number of the transistors Ts may be substantially the same as the number of the variable resistors R within one layer. For a method of operating the non-volatile memory device according to the exemplary embodiment, the description with reference to FIGS. 1 and 3 should be referred to.

Figure 5:
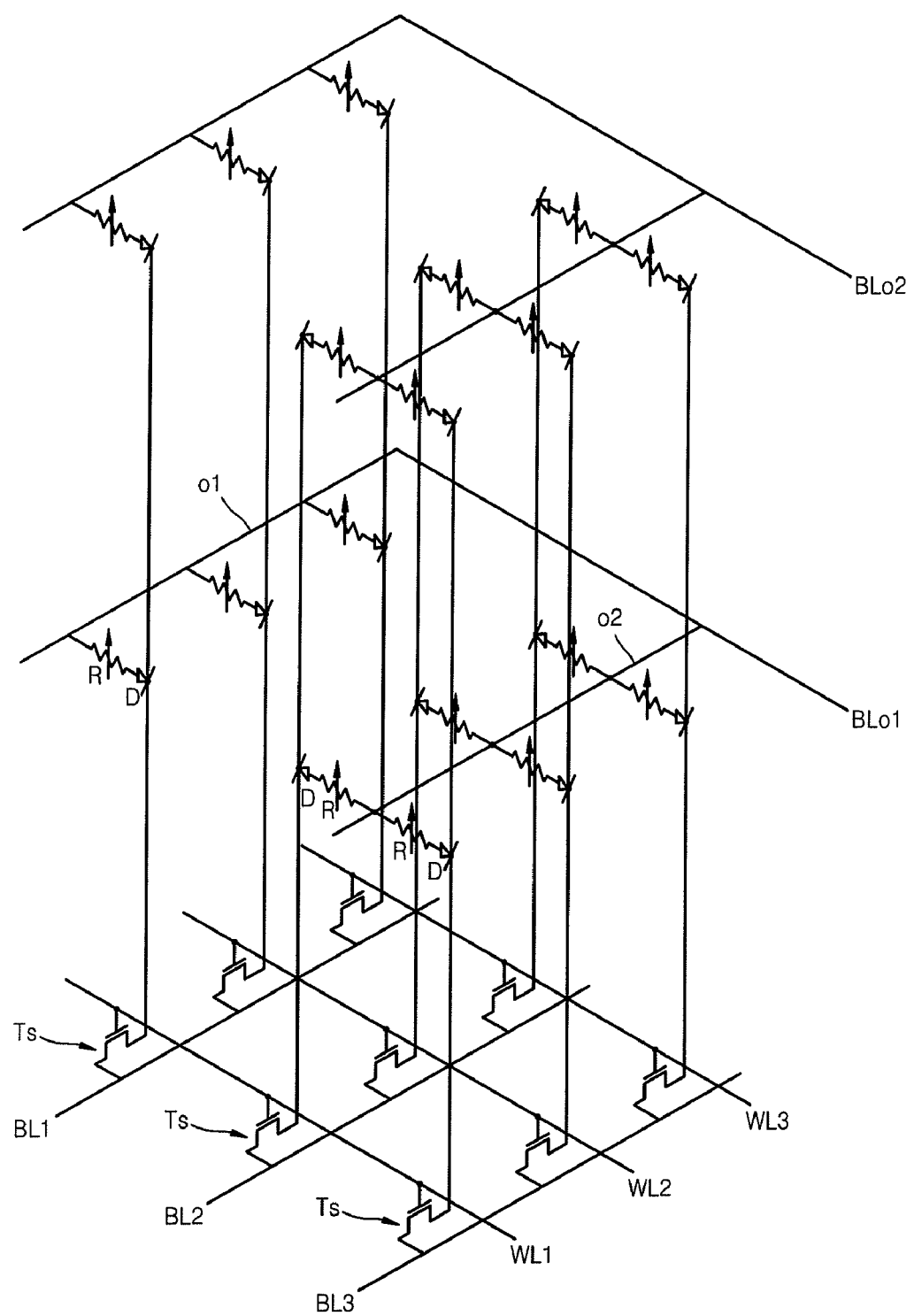
FIG. 5 is a circuit diagram illustrating a non-volatile memory device according to another exemplary embodiment of the present invention.

FIG. 5 is a circuit diagram illustrating a non-volatile memory device according to another exemplary embodiment of the present invention. The non-volatile memory device of FIG. 5 is the same as the non-volatile memory device of FIG. 1 with some modified components. Thus, common descriptions in both exemplary embodiments will be omitted.

Referring to FIG. 5, variable resistors R may be coupled to first ends a1 of second layer selection bit lines BLo1 and BLo2. In this exemplary embodiment, the first layer selection bit lines BLe1 and BLe2 of FIG. 1 and the variable resistors R coupled thereto may be omitted. Accordingly, the number of the transistors Ts may be substantially the same as the number of the variable resistors R within one layer. For a method of operating the non-volatile memory device according to the exemplary embodiment, the description with reference to FIGS. 1 and 3 should be referred to.

Figure 6:
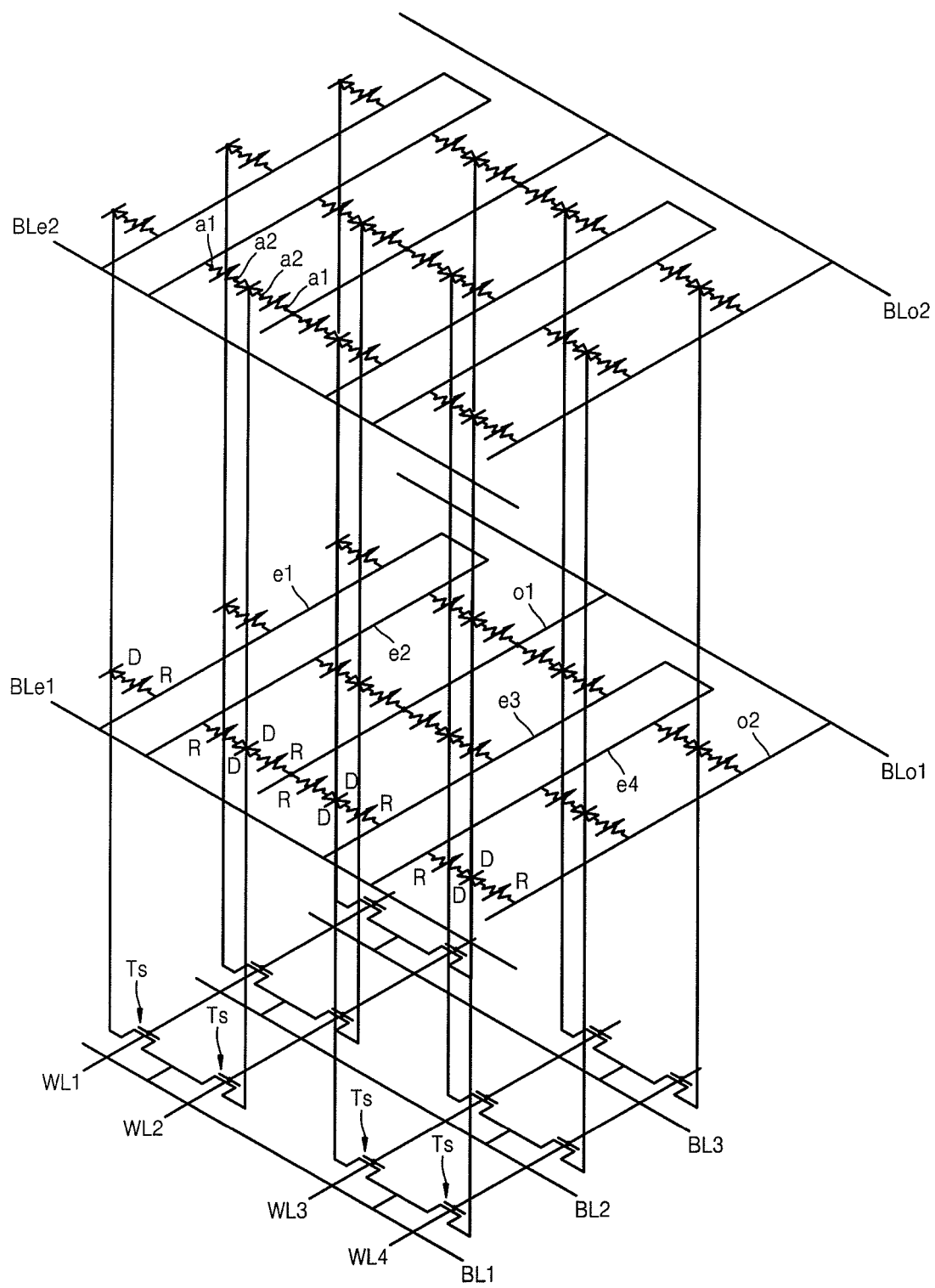
FIG. 6 is a circuit diagram illustrating a non-volatile memory device according to another exemplary embodiment of the present invention.

FIG. 6 is a circuit diagram illustrating a non-volatile memory device according to another exemplary embodiment of the present invention. The non-volatile memory device of FIG. 6 is the same as the non-volatile memory device of FIG. 1 with some modified components. Thus common descriptions in both exemplary embodiments will be omitted.

Referring to FIG. 6, first layer selection bit lines BLe1 and BLe2 may include first branch lines e1, e2, e3, and e4, and second layer selection bit lines BLo1 and BLo2 may include second branch lines o1 and o2. Unlike FIG. 1, each of the first branch lines e1, e2, e3, and e4 and each of the second branch lines o1 and o2 are not arranged alternately. The number and the arrangement of the first layer selection bit lines BLe1 and BLe2 and the second layer selection bit lines BLo1 and BLo2 of the present invention should not be limited thereto.

The variable resistors R may be arranged between one of the second branch lines o1 and o2 and one of the first branch lines e1, e2, e3, and e4, which is the nearest to the one of the second branch lines o1 and o2. Accordingly, no variable resistor R is arranged between two of the first branch lines e1, e2, e3, and e4 that are most adjacent to each other. The number and the arrangement of the first branch lines e1, e2, e3, and e4 and the second branch lines o1 and o2 of the present invention should not be limited thereto.

The first ends a1 of the variable resistors R may be coupled to the first branch lines e1, e2, e3, and e4 or to the second branch lines o1 and o2. The variable resistors R are arranged in a plurality of rows along the extension direction of the first branch lines e1, e2, e3, and e4 and the second branch lines o1 and o2, and in a plurality of lines in a direction perpendicular to the extension direction of the first branch lines e1, e2, e3, and e4 and the second branch lines o1 and o2.

A plurality of pairs of the variable resistors R may be arranged between one of the first branch lines e1, e2, e3, and e4 and one of the second branch lines o1 and o2 that is near the one of the first branch lines e1, e2, e3, and e4, along the extension direction of the first and second branch lines e1, e2, e3, e4, o1, and o2. The pairs of the variable resistors R may be coupled such that diodes D are interposed between the second ends a2 of the variable resistors R.

The plurality of the bit lines BL1, BL2, and BL3 may be coupled to the second ends a2 of the variable resistors R. A plurality of selection transistors Ts may be interposed between the bit lines BL1, BL2, and BL3 and the variable resistors R, and in detail, between the bit lines BL1, BL2, and BL3 and the diodes D. A plurality of word lines WL1, WL2, WL3, and WL4 may be coupled to the selection transistors Ts so as to switch on and off the selection transistors Ts. For example, the word lines WL1, WL2, WL3, and WL4 may be arranged to cross the bit lines BL1, BL2, and BL3 so as to allow selective access of each of the variable resistors R of each layer.

The bit lines BL1, BL2, and BL3 may be arranged to be shared by the variable resistors R that are arranged along the rows. For example, the bit lines BL1, BL2, and BL3 may be extended across the first branch lines e1, e2, e3, and e4 and the second branch lines o1 and o2. The word lines WL1, WL2, WL3, and WL4 may be coupled to be shared by the selection transistors Ts that are arranged in each column. For example, the word lines WL1, WL2, WL3, and WL4 may extend parallel to the first branch lines e1, e2, e3, and e4 and the second branch lines o1 and o2.

Meanwhile, according to another exemplary embodiment, as illustrated in FIG. 4, the second layer selection bit lines BLo1 and BLo2 and the variable resistors R coupled thereto may be omitted in the non-volatile memory device of FIG. 6. Further more, according to another exemplary embodiment, as illustrated in FIG. 5, the first layer selection bit lines BLe1 and BLe2 and the variable resistors R coupled thereto may be omitted.

Figure 7:
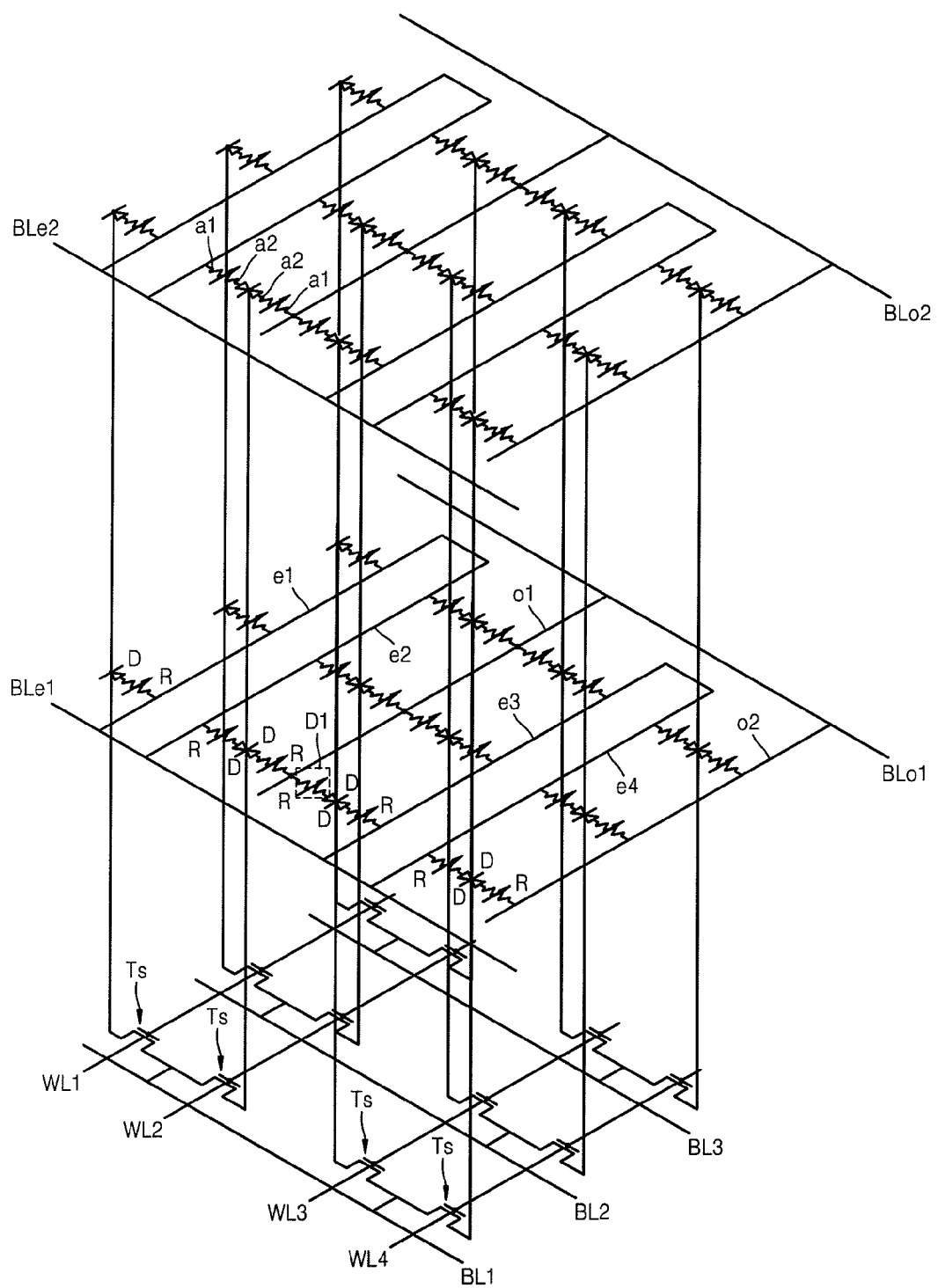
FIG. 7 is a circuit diagram illustrating a method of accessing one of the variable resistors of the non-volatile memory device of FIG. 6 according to an exemplary embodiment of the present invention.

FIG. 7 is a circuit diagram illustrating a method of operating the non-volatile memory device of FIG. 6 according to an exemplary embodiment of the present invention.

Referring to FIG. 7, one of the variable resistors R can be accessed randomly. For example, by selecting one first layer selection bit line BLe1, selecting one bit line BL1, and one word line WL3, a variable resistor R in one selected memory cell D1 can be accessed. By using this random access, the non-volatile memory device can be used as a storage medium for codes.

Writing data to or reading data from the variable resistor R in the memory cell D1 can be performed by applying corresponding operational voltages to the first layer selection bit line BLe1, the bit line BL1, and the word line WL3 after or at the same time as the above selection operations.

The above-described method of writing/reading data by randomly accessing the variable resistor R in the memory cell D1 may also be applied to other memory cells (not shown).

Figure 8:
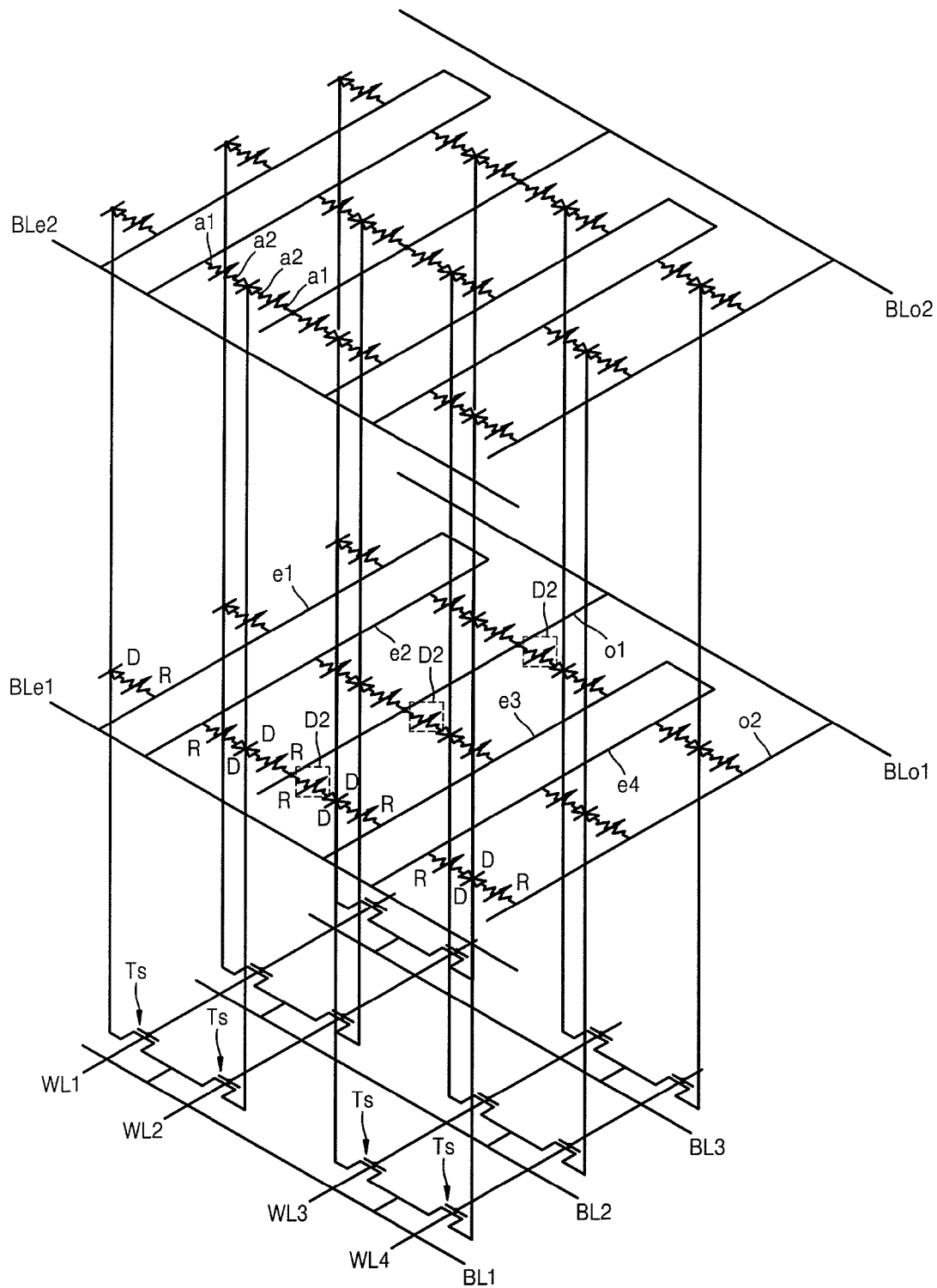
FIG. 8 is a circuit diagram illustrating a method of accessing at least two of the variable resistors of the non-volatile memory device of FIG. 6 according to another exemplary embodiment of the present invention.

FIG. 8 is a circuit diagram illustrating a method of operating the non-volatile memory device of FIG. 6 according to another exemplary embodiment of the present invention.

Referring to FIG. 8, at least two variable resistors R can be accessed at the same time. For example, by selecting one second layer selection bit line BLo1, selecting at least two bit lines BL1, BL2, and BL3, and selecting one word line WL3, the variable resistors R in selected memory cells D2 may be accessed at the same time. By using this multiple access, the non-volatile memory device can be used as a large capacity storage medium.

Writing data to or reading data from the variable resistor R in the memory cell D2 can be performed by applying corresponding operational voltages to the second layer selection bit line BLo1, the bit lines BL1, BL2, and BL3 and the word line WL3 after or at the same time as the above selection operations.

The above-described method of writing/reading data by randomly accessing the variable resistor R in the memory cells D2 may also be applied to other memory cells (not shown).

Figure 9:
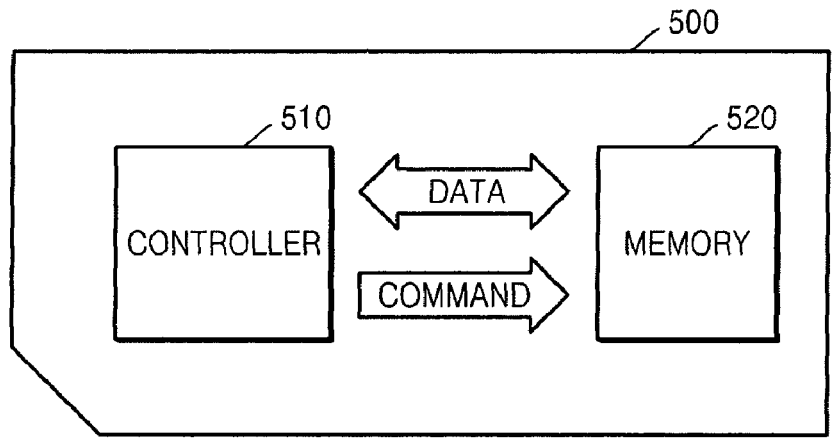
FIG. 9 is a block diagram illustrating a memory card according to an exemplary embodiment of the present invention.

FIG. 9 is a block diagram illustrating a memory card 500 according to an exemplary embodiment of the present invention.

Referring to FIG. 9, a controller 510 and a memory 520 can exchange electrical signals. For example, the memory 520 and the controller 510 can exchange data according to a command of the controller 510. Accordingly, the memory card 500 can store data to the memory 520 or output data from the memory 520. The memory 520 may have one of the structures of the non-volatile memory device described with reference to FIGS. 1 through 8.

The memory card 500 may be used as a data storage medium of various mobile appliances. For example, the memory card 500 may include a multi media card (MMC) or a secure digital (SD) card.

Figure 10:
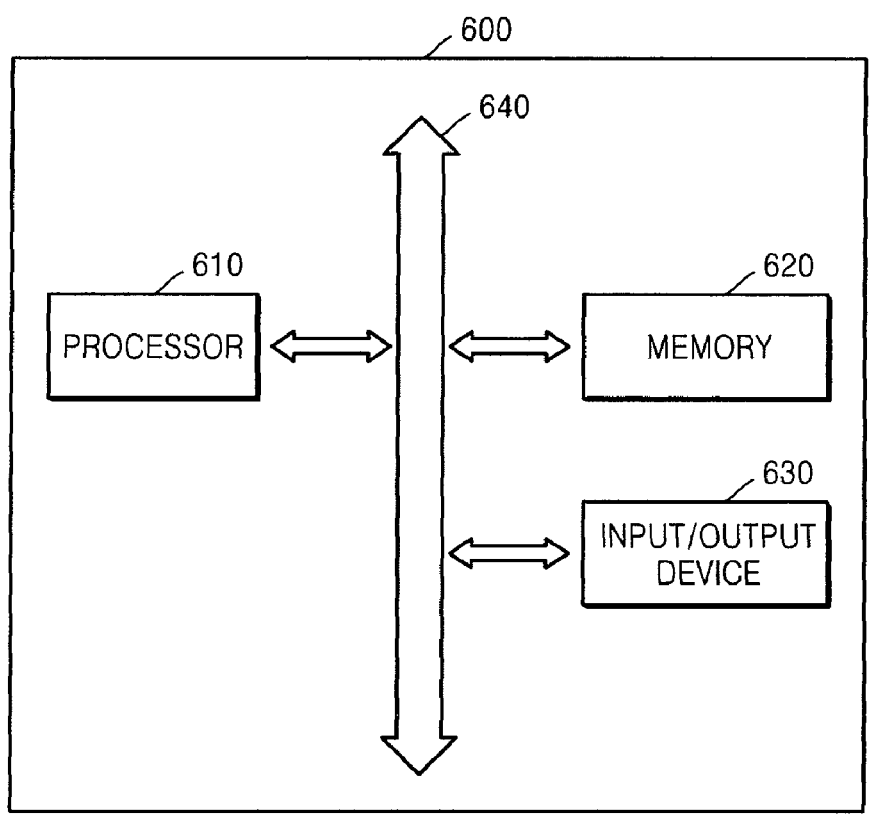
FIG. 10 is a block diagram illustrating an electronic system according to an exemplary embodiment of the present invention.

FIG. 10 is a block diagram illustrating an electronic system 600 according to an exemplary embodiment of the present invention.

Referring to FIG. 10, a processor 610, an input/output device 630, and a memory 620 may transmit or receive data to and from one another through a bus 640. The processor 610 may execute a program and control the system 600. The input/output device 630 may be used in inputting or outputting data of the system 600. The system 600 may be connected to an external device such as a personal computer or a network and may exchange data with the external device using the input/output device 630.

The memory 620 may store codes for the operation of the processor 610 and data. For example, the memory 620 may have one of the structures of the non-volatile memory device described with reference to FIGS. 1 through 8.

For example, the system 600 may constitute various electronic control devices that require the memory 620. For example, the system 600 may be used for a mobile phone, an MP3 player, a navigation device, a sold state disk (SSD), or household appliances.

While aspects of the present invention have been particularly shown and described with reference to differing embodiments thereof, it should be understood that these exemplary embodiments should be considered in a descriptive sense only and not for purposes of limitation. Descriptions of features or aspects within each exemplary embodiment should typically be considered as available for other similar features or aspects in the remaining exemplary embodiments.

Thus, although a few exemplary embodiments have been shown and described, it would be appreciated by those of ordinary skill in the art that changes may be made in these exemplary embodiments without departing from the principles and spirit of the invention, the scope of which is defined in the claims and their equivalents.

What is claimed is:

1. A non-volatile memory device comprising:
a plurality of variable resistors for storing data arranged in at least one layer;
at least one layer selection bit line coupled to a first end of the plurality of the variable resistors;
a plurality of bit lines coupled to a second end of the plurality of the variable resistors;
a plurality of selection transistors coupled between the plurality of the bit lines and the plurality of the variable resistors; and
a plurality of word lines coupled to the plurality of the selection transistors so as to switch the plurality of the selection transistors on or off;
wherein the at least one of the variable resistors can be accessed by selectively applying an operational voltage to a combination of at least one of layer selection bit line, at least one of the bit lines and at least one of the word lines.

2. The non-volatile memory device of claim 1, further comprising a plurality of diodes that is coupled between the plurality of the variable resistors and the plurality of the selection transistors.

3. The non-volatile memory device of claim 2, wherein the diodes are arranged in a plurality of pairs, in opposite directions to each other, between two second ends of the variable resistors to rectify currents.

4. The non-volatile memory device of claim 1, wherein the plurality of the variable resistors is arranged in a matrix in each layer, and the plurality of the bit lines and the plurality of the word lines cross one another to allow selective access to the variable resistors.

5. The non-volatile memory device of claim 1, wherein the at least one layer selection bit line comprises a plurality of branch lines that is connected to one another, and the plurality of the variable resistors is arranged along the extension direction of the plurality of the branch lines.

6. The non-volatile memory device of claim 5, wherein the of variable resistors comprises first groups which are arranged in rows along the extension direction of the plurality of the branch lines, and each first group of variable resistors is commonly coupled to one of the plurality of the bit lines.

7. The non-volatile memory device of claim 6, wherein the plurality of the word lines extends across the plurality of the branch lines, and the plurality of the bit lines is parallel to the plurality of the branch lines.

8. The non-volatile memory device of claim 5, wherein the plurality of the word lines is parallel to the plurality of the branch lines, and the plurality of the bit lines extends across the plurality of the branch lines.

9. The non-volatile memory device of claim 1, wherein the at least one layer selection bit line comprises a first layer selection bit line and a second layer selection bit line that are separated from each other in each layer.

10. The non-volatile memory device of claim 9, wherein the first layer selection bit line comprises a plurality of first branch lines that is arranged in parallel and connected to one another, and the second layer selection bit line comprises a plurality of second branch lines that is arranged in parallel and connected to one another.

11. The non-volatile memory device of claim 10, wherein the plurality of the variable resistors is arranged in a plurality of pairs between the plurality of the first branch lines and the plurality of the second branch lines, and each pair of the variable resistors is commonly coupled to each of the selection transistors.

12. The non-volatile memory device of claim 1, wherein the plurality of the variable resistors is arranged in a plurality of layers, and the at least one layer selection bit line comprises a plurality of layer selection bit lines arranged in the plurality of layers.

13. The non-volatile memory device of claim 12, wherein the plurality of the selection transistors is commonly coupled to the variable resistors arranged in a plurality of layers.

* * * * *